(12) United States Patent  
Yamanaka et al.

(10) Patent No.: US 8,969,903 B2  
(45) Date of Patent: Mar. 3, 2015

(54) OPTICAL ELEMENT AND SEMICONDUCTOR LIGHT EMITTING DEVICE USING THE OPTICAL ELEMENT

(71) Applicant: Panasonic Corporation, Osaka (JP)

(72) Inventors: Kazuhiko Yamanaka, Osaka (JP); Shinichi Takigawa, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/095,946

(22) Filed: Dec. 3, 2013

(65) Prior Publication Data

US 2014/0084325 A1 Mar. 27, 2014

Related U.S. Application Data

(63) Continuation of application No. PCT/JP2012/001612, filed on Mar. 8, 2012.

(30) Foreign Application Priority Data

Jul. 12, 2011 (JP) ................... 2011-153904

(51) Int. Cl.
*H01L 33/50* (2010.01)
*H01L 33/58* (2010.01)
(Continued)

(52) U.S. Cl.
CPC ... *F21K 9/56* (2013.01); *G02F 2/02* (2013.01); *H01L 33/58* (2013.01); *G02B 3/0062* (2013.01); *G02B 3/0056* (2013.01); *H01L 33/505* (2013.01); *H01S 5/005* (2013.01)
USPC ............................................. 257/98; 257/79

(58) Field of Classification Search
CPC ..... H01L 33/50; H01L 33/505; H01L 33/508; H01L 33/507; H01L 33/58
USPC ....................................... 257/79–100
See application file for complete search history.

(56) References Cited

U.S. PATENT DOCUMENTS 5,978,139 A 11/1999 Hatakoshi et al.
8,434,910 B2 * 5/2013 Kim ................. 362/311.02
(Continued)

FOREIGN PATENT DOCUMENTS

CN 101677116 A 3/2010
EP 2 128 906 A1 12/2009
JP 10-092002 A 4/1998
(Continued)

OTHER PUBLICATIONS

International Search Report issued in International Application No. PCT/JP2012/001612 with Date of mailing May 1, 2012, with English Translation.

*Primary Examiner* — Matthew W Such
*Assistant Examiner* — Scott Stowe
(74) *Attorney, Agent, or Firm* — McDermott Will & Emery LLP

(57) ABSTRACT

An optical element includes a phosphor layer containing a phosphor which is excited by light of a first wavelength and radiates light of a second wavelength different from the first wavelength, a first optical member provided on a first surface of the phosphor layer and configured to concentrate light in the phosphor layer, and a second optical member provided on the first surface of the phosphor layer or the same side to which the first surface faces, or on a second surface opposite to the first surface, and configured to convert light radiated from the phosphor layer into parallel light.

14 Claims, 16 Drawing Sheets

(51) Int. Cl.
*F21K 99/00* (2010.01)
*G02F 2/02* (2006.01)
*G02B 3/00* (2006.01)
*H01S 5/00* (2006.01)

(56) References Cited

U.S. PATENT DOCUMENTS

| | | |
|---|---|---|
| 2003/0026002 A1 | 2/2003 | Lopez-Hernandez et al. |
| 2005/0213180 A1 | 9/2005 | Lopez-Hernandez et al. |
| 2009/0003400 A1 | 1/2009 | Nagahama et al. |
| 2009/0185589 A1 | 7/2009 | Hattori et al. |
| 2010/0007267 A1 | 1/2010 | Imai et al. |

FOREIGN PATENT DOCUMENTS

| | | |
|---|---|---|
| JP | 2002-169480 A | 6/2002 |
| JP | 2002-341246 A | 11/2002 |
| JP | 2003-295319 A | 10/2003 |
| JP | 2005-251929 A | 9/2005 |
| JP | 2009-158620 A | 7/2009 |
| JP | 2010-186886 A | 8/2010 |
| JP | 2010-262770 A | 11/2010 |
| WO | 2007/105647 A1 | 9/2007 |
| WO | 2008/105428 A1 | 9/2008 |

* cited by examiner

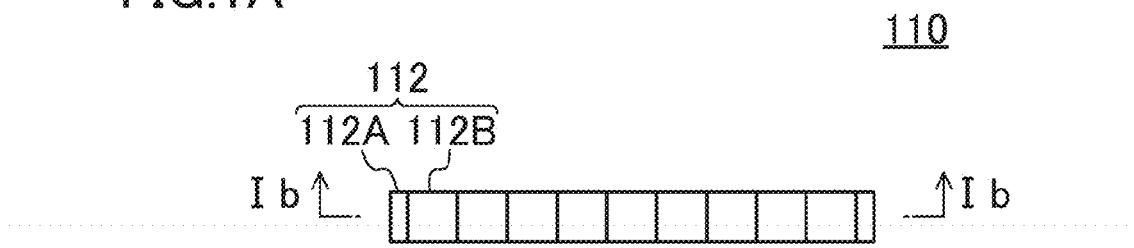
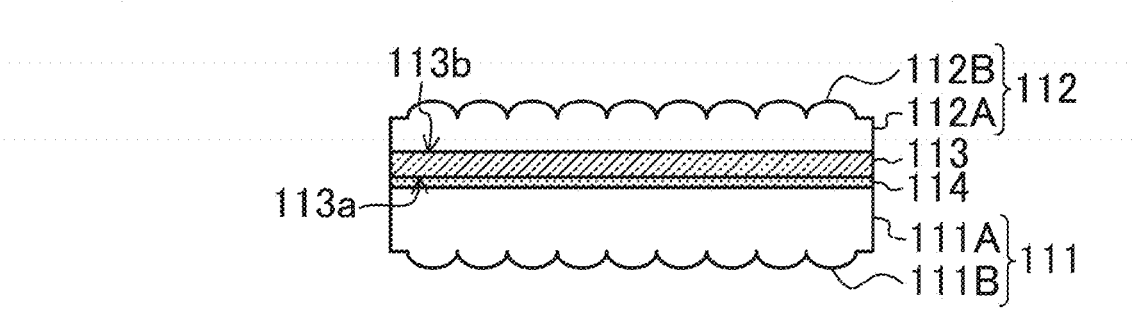
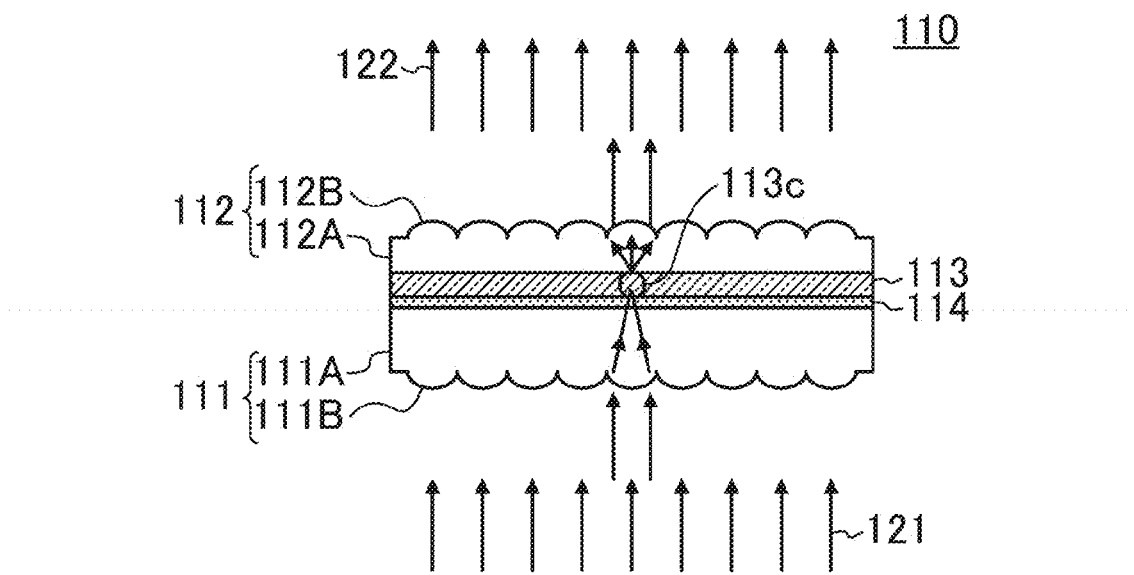

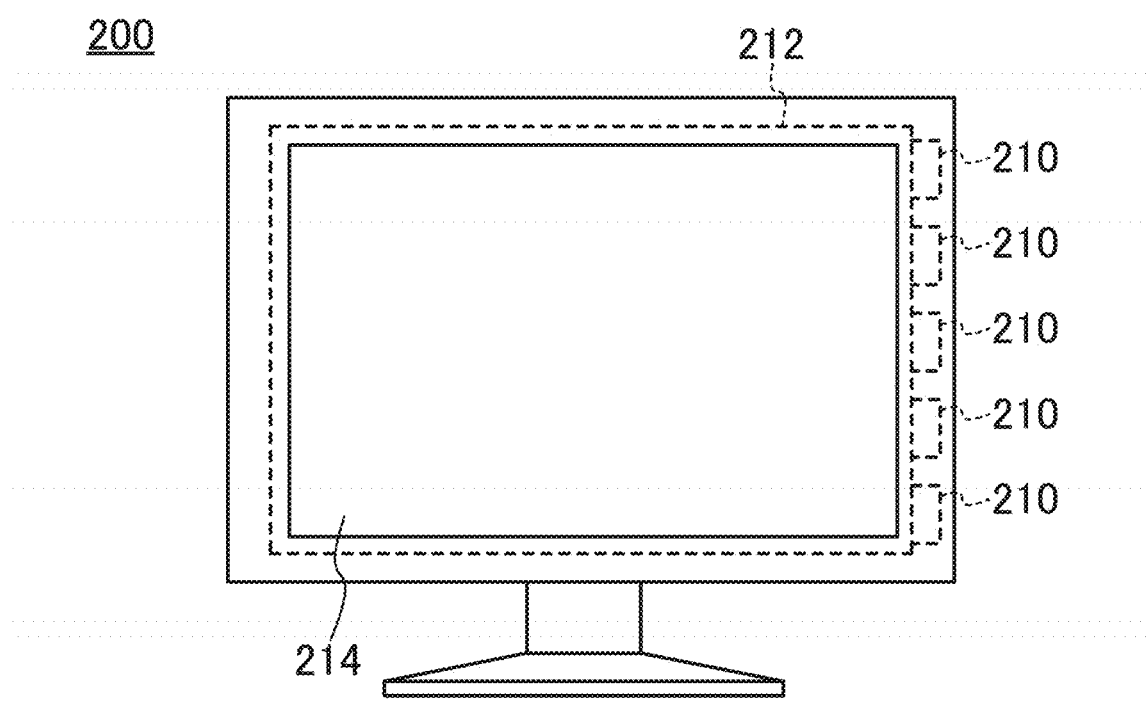

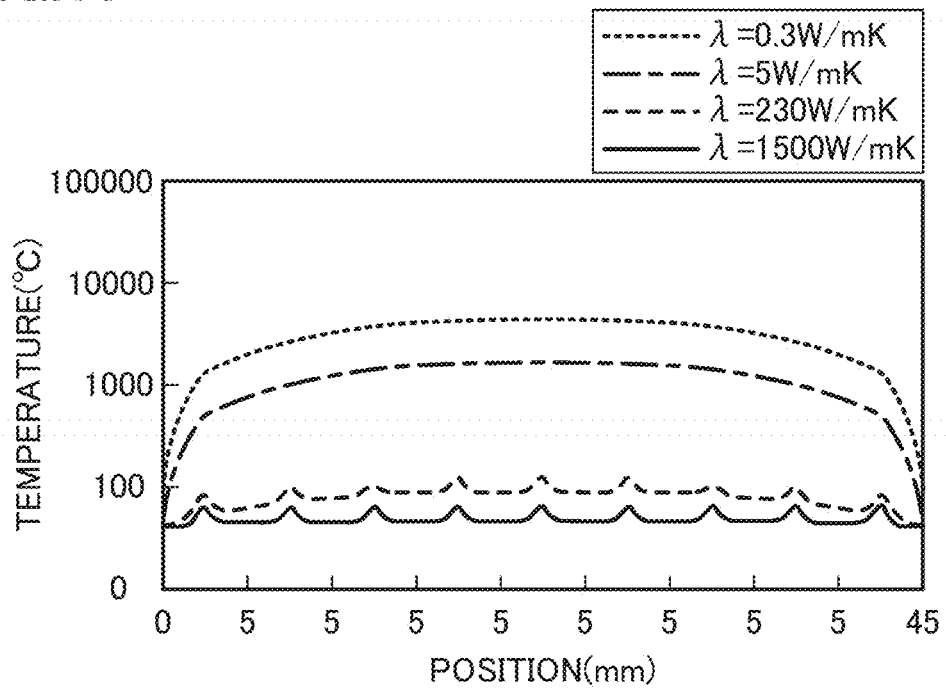

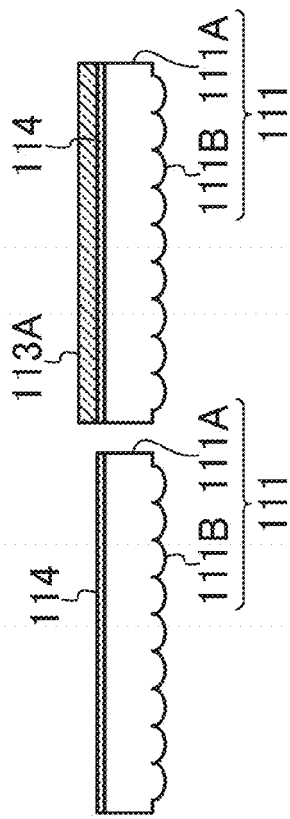

OPTICAL ELEMENT AND SEMICONDUCTOR LIGHT EMITTING DEVICE USING THE OPTICAL ELEMENT

CROSS-REFERENCE TO RELATED APPLICATIONS

This is a continuation of International Application No. PCT/JP2012/001612 filed on Mar. 8, 2012, which claims priority to Japanese Patent Application No. 2011-153904 filed on Jul. 12, 2011. The entire disclosures of these applications are incorporated by reference herein.

BACKGROUND

The present disclosure relates to optical elements and semiconductor light emitting devices using the optical elements, and particularly relates to optical elements capable of emitting light with directivity, and semiconductor light emitting devices using the optical elements.

In recent years, semiconductor light emitting elements, such as high-efficiency and high-output light emitting diodes (LEDs) using a gallium nitride material or a gallium arsenide material, have been commercialized. Accordingly, display light sources using the semiconductor light emitting elements have also been commercialized. As the display light sources using the semiconductor light emitting elements, edge-lit light sources in which light from an LED placed on a side of the screen is guided to the entire screen of the display device, using a light guide plate placed on the back side of the screen have been gaining attention. A further reduction in energy loss of the display light sources by using a semiconductor laser element which is superior in directivity to LEDs is being considered, as well (see, e.g., Japanese Patent Publication No. 2009-158620).

SUMMARY

However, conventional light sources for display devices have the following problems. In light sources for display devices, in general, light emitted from a light emitting element, e.g., a laser element, is converted into light of a different wavelength. The wavelength is converted by making the light that is emitted from the light emitting element enter a reflector containing a phosphor, for example. The phosphor is excited when the light enters the phosphor, and fluorescent light of a wavelength different from the wavelength of the light having entered the phosphor is emitted. However, directivity of the light is lost by the wavelength conversion. Thus, even if a light emitting element which emits light superior in directivity, such as a laser element, is used, it is difficult to obtain display light sources which emits light superior in directivity.

The present disclosure was made to solve the above problems, and it is an objective of the invention to provide an optical element capable of emitting light with directivity even if the wavelength is converted, and a semiconductor light emitting device using the optical element.

To achieve the above objective, an optical element of the present disclosure is configured to convert light radiated from a phosphor layer into parallel light.

Specifically, a first optical element of the present disclosure includes: a phosphor layer containing a phosphor which is excited by light of a first wavelength and radiates light of a second wavelength different from the first wavelength; a first optical member provided on a first surface of the phosphor layer and configured to concentrate light in the phosphor layer; and a second optical member provided on a second surface of the phosphor layer, which is opposite to the first surface, and configured to convert light radiated from the phosphor layer into parallel light.

The first optical element includes a first optical member provided on a first surface of the phosphor layer and configured to concentrate light in the phosphor layer, and a second optical member provided on the second surface and configured to convert light radiated from the phosphor layer into parallel light. With this configuration, it is possible to convert light of the first wavelength into light of the second wavelength in the phosphor layer, and emit the light of the second wavelength from the optical element as parallel light.

In the first optical element, the first optical member may be a first transparent substrate having a condensing lens, or may be a first transparent substrate having a diffraction grating.

In the first optical element, the second optical member may be a second transparent substrate provided on the second surface and having a collimator lens.

A second optical element includes: a phosphor layer containing a phosphor which is excited by light of a first wavelength and radiates light of a second wavelength different from the first wavelength; and a third optical member provided on a first surface of the phosphor layer and configured to concentrate light in the phosphor layer and convert light radiated from the phosphor layer into parallel light.

The second optical element includes a third optical member provided on the first surface of the phosphor layer and configured to concentrate light in the phosphor layer and convert light radiated from the phosphor layer into parallel light. With this configuration, it is possible to convert light of the first wavelength into light of the second wavelength in the phosphor layer, and emit the light of the second wavelength from the optical element as parallel light.

In the second optical element, the third optical member may be a third transparent substrate which includes a diffraction grating provided on a surface further from the phosphor layer, and a reflecting mirror provided on a surface facing the phosphor layer.

The second optical element may further include a reflective layer provided on a second surface of the phosphor layer, which is opposite to the first surface, wherein the third optical member is a convex lens.

The first optical element may further include a thermal conductive layer provided between the phosphor layer and the first optical member or the second optical member, and having a thermal conductivity higher than a thermal conductivity of the phosphor layer.

The second optical element may further include a thermal conductive layer provided on the second surface of the phosphor layer, which is opposite to the first surface, and having a thermal conductivity higher than a thermal conductivity of the phosphor layer.

In these cases, the thermal conductive layer may be made of zinc oxide, aluminum nitride, or diamond. Further, the thermal conductive layer may be a multilayer film.

In the first optical element, the phosphor layer may include a plurality of first regions each containing the phosphor, and a second region which surrounds the plurality of first regions and has a thermal conductivity higher than a thermal conductivity of the first regions, wherein the first optical member concentrates light in each of the plurality of first regions.

In the second optical element, the phosphor layer includes a plurality of first regions each containing the phosphor, and a second region which surrounds the plurality of first regions and has a thermal conductivity higher than a thermal conductivity of the first regions, wherein the third optical member concentrates light in each of the plurality of first regions.

In these cases, the second region may be made of zinc oxide, aluminum nitride, or diamond.

A semiconductor light emitting device of the present disclosure includes any one of the optical elements of the present disclosure, and a light emitting element which emits the light of the first wavelength.

The semiconductor light emitting device of the present disclosure may further include a light dividing section which divides light emitted from the light emitting element into a plurality of optical paths having optical axes parallel to each other to have the optical paths enter the optical element.

According to the optical element and the semiconductor light emitting device of the present disclosure, it is possible to provide an optical element capable of emitting light with directivity even if the wavelength is converted, and a semiconductor light emitting device using the optical element.

BRIEF DESCRIPTION OF THE DRAWINGS

FIG. 1A and FIG. 1B show an optical element of the first embodiment. FIG. 1(A) is a plan view. FIG. 1(B) is a cross-sectional view taken along the line Ib-Ib of FIG. 1(A).

FIG. 2 is a cross-sectional view illustrating a function of the optical element of the first embodiment.

FIG. 4(A) is a plan view. FIG. 4(B) is a cross-sectional view taken long the line IVb-IVb of FIG. 4(A).

FIG. 5 is a schematic view of an example image display device in which the optical element of the first embodiment is used.

FIG. 8(A) is a plan view. FIG. 8(B) is a cross-sectional view taken along the line VIIIb-VIIIb of FIG. 8(A).

FIG. 10 is a graph showing results of simulations of temperature distributions of the phosphor layer in the optical element of the first variation.

FIGS. 11A-11D show cross-sectional views for illustrating a method for fabricating the optical element of the first embodiment in the order of steps.

DETAILED DESCRIPTION

Figure 3:
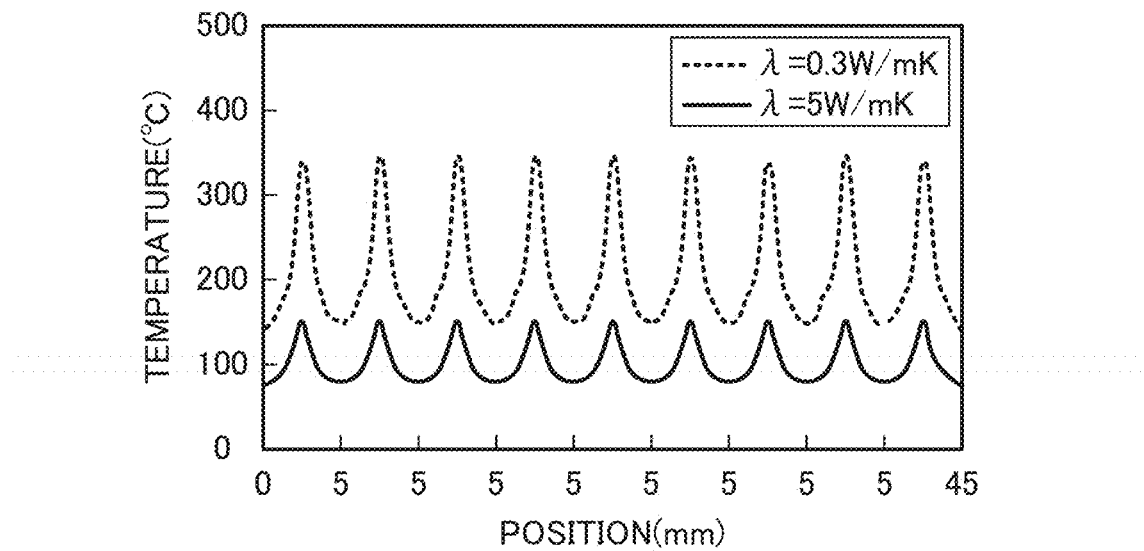
FIG. 3 is a graph showing results of simulations of temperature distributions of the phosphor layer in the optical element of the first embodiment.

In the present disclosure, the term "parallel light" includes not only perfect parallel light, but also approximately parallel light spreading at an angle of from several to dozen degrees.

First Embodiment

As illustrated in FIG. 1(a) and FIG. 1(b), an optical element 110 of the first embodiment is an optical element using a phosphor, which converts the wavelength of incident light before outputting the light. FIG. 1 shows the optical element 110 in a rod-like shape that is suitable as an edge-lit light source of a liquid crystal television receiver, etc. As illustrated in FIG. 1, the optical element 110 includes a phosphor layer 113, a first optical member 111 provided on a first surface 113a of the phosphor layer 113, with a thermal conductive layer 114 interposed therebetween, and a second optical member 112 provided on a second surface 113b of the phosphor layer 113.

The phosphor layer 113 contains a phosphor which is excited by the incident light of a first wavelength and emits fluorescent light of a second wavelength. The phosphor may be anything, and may be, for example, a rare earth phosphor, such as cerium-doped yttrium aluminum garnet (YAG:Ce3+) or β-sialon, or a core/shell type quantum dot phosphor made of a compound semiconductor, such as cadmium selenide (CdSe), zinc selenide, zinc sulfide, or indium phosphide.

The thermal conductive layer 114 may be made of a layer which absorbs less light and which has a higher mean thermal conductivity than the phosphor layer 113. For example, the thermal conductive layer 114 may be made of a zinc oxide (ZnO) film, an aluminum nitride (AlN) film, or diamond.

The first optical member 111 includes a first transparent substrate 111A and a microlens 111B formed on a first surface of the first transparent substrate 111A. The first optical member 111 is fixed to the first surface 113a of the phosphor layer 113, with a second surface opposite to the first surface thereof facing the phosphor layer 113, and with the thermal conductive layer 114 interposed therebetween. The second optical member 112 includes a second transparent substrate 112A and a microlens 112B formed on a first surface of the second transparent substrate 112A. The second optical member 112 is fixed to the second surface 113b of the phosphor layer 113, with a second surface opposite to the first surface thereof facing the phosphor layer 113. The first transparent substrate 111A and the second transparent substrate 112A may be made of soda lime, borosilicate crown glass (BK7), or synthetic silica, etc. In general, the first optical member 111 has a greater thickness than the second optical member 112. Further, the focal length of the microlens 111B of the first optical member 111 is longer than the focal length of the microlens 112B of the second optical member 112.

FIG. 2 illustrates a function of the optical element 110 of the present embodiment. As illustrated in FIG. 2, light 121 of a first wavelength enters the first optical member 111. The light 121 of the first wavelength may be parallel light generated using a light emitting element (not shown) such as a semiconductor laser element, and an optical element (not shown) such as a lens. The light emitting element may be a semiconductor laser element made, for example, of a gallium nitride compound semiconductor and having a luminous wavelength of about 430 nm to 480 nm. Having a luminous wavelength of 430 nm to 480 nm means that the emitted light has a peak wavelength ranging from 430 nm to 480 nm.

The light 121 of the first wavelength, which is parallel light entering the first optical member 111, is concentrated in a micro region 113c of the phosphor layer 113 by the microlens 111B, which is a condensing lens. The phosphor contained in the phosphor layer 113 absorbs the light 121 of the first wavelength, and radiates light 122 of a second wavelength. In the case where the first wavelength is about 430 nm to 480 nm, YAG:Ce3+ or a quantum dot phosphor using CdSe may be used so that the second wavelength can be in a range of about 480 nm to 700 nm. Having the second wavelength of 480 nm to 700 nm means that the light of the second wavelength which is emitted from the phosphor has a peak wavelength ranging from 480 nm to 700 nm, and a spectral distribution ranging from 480 nm to 700 nm.

The light 122 of the second wavelength radiated from the phosphor is emitted from the phosphor layer 113 as diffused light. Of the light 122 of the second wavelength, light directed toward the second optical member 112 is emitted to the outside of the optical element 110 as parallel light, due to the microlens 112B, which is a collimator lens. Although the light 122 of the second wavelength emitted from the phosphor layer 113 is diffused light, it is emitted through the micro region 113c and thus effectively converted into parallel light by the microlens 112B of the second optical member 112. Further, part of the light 121 of the first wavelength is not absorbed by the phosphor, but is diffused to the second optical member 112 and is emitted to the outside of the optical element 110 as parallel light, similar to the light of the second wavelength.

On the other hand, part of the light 121 of the first wavelength which is absorbed in the phosphor is not converted into fluorescence, but converted into heat. Heat generated in the phosphor layer 113 is efficiently transmitted to a periphery of the optical element 110 by the thermal conductive layer 114 in contact with the phosphor layer 113, and is dissipated. The thermal conductive layer 114 preferably has a thickness of about one fourth of the second wavelength. With this thickness, the thermal conductive layer 114 functions as a reflective coat with respect to the light 122 of the second wavelength. Thus, the light 122 of the second wavelength emitted from the phosphor layer 113 can be efficiently guided to the second optical member 112.

FIG. 1 illustrates an example in which the thermal conductive layer 114 is provided on the first surface 113a, but the thermal conductive layer 114 may be provided on the second surface 113b. In the case where the thermal conductive layer 114 is provided on the second surface 113b, it is preferable that the thermal conductive layer 114 has a thickness which enables the thermal conductive layer 114 to function as a reflective coat with respect to the light 121 of the first wavelength, and which prevents the thermal conductive layer 114 from functioning as a reflective coat with respect to the light 122 of the second wavelength.

Figure 4A:
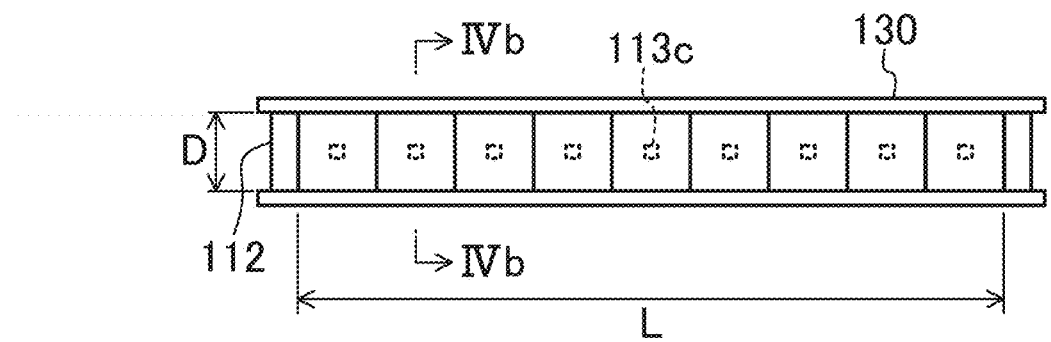
FIG. 4(A) and FIG. 4(B) show a configuration of the optical element used in the simulations.
Figure 4B:
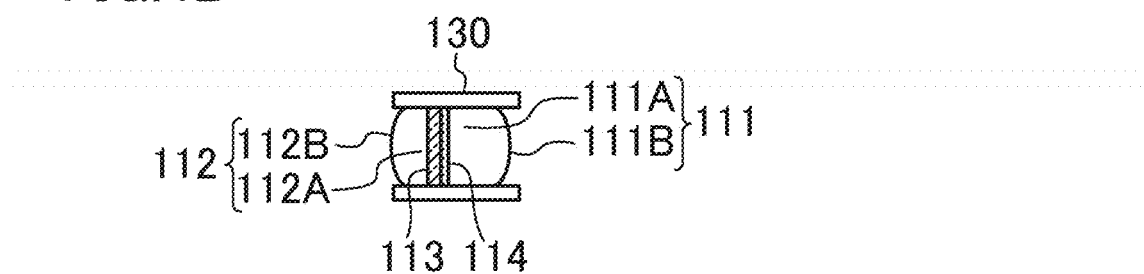

Effects of the thermal conductive layer 114 will be described below. FIG. 3 shows results of simulations of temperature distributions in the case where the thermal conductive layer 114 is made of ZnO (thermal conductivity $\lambda$=5 W/mK) and where the thermal conductive layer 114 is made of glass ($\lambda$=0.3 W/mK). An optical element having a simple configuration as shown in FIG. 4 was used in the simulations, in which a thermal conductive layer and a phosphor layer are sandwiched between thin optical members with no microlens. Appropriate parameters were set, assuming that a semiconductor laser element which emits light of a wavelength of 450 nm is a light source (not shown) and that YAG:Ce3+ is a phosphor. The appearance of the optical element is such that the long axis L is 45 mm and a short axis D is 5 mm, and a heat dissipation plate 130 is fixed to a longitudinal side surface. Here, the optical element is thermally connected to the heat dissipation plate 130, and the interface therebetween is kept at 40° C. The thickness of the first optical member 111 is 0.5 mm. The thickness of the second optical member 112 is 0.2 mm. The thickness of each of the phosphor layer 113 and the thermal conductive layer 114 is 0.1 mm. The first optical member 111 has nine condensing lenses arranged in the longitudinal direction. Excitation light incident on each of the condensing lenses is concentrated in a region of about 1.0 mm square on the phosphor layer 113. The first optical member 111 and the second optical member 112 are made of glass. The phosphor layer 113 is made of a resin material whose thermal conductivity is approximately equal to a thermal conductivity of the glass.

A light source (not shown) with a light output of 5 W is placed. Light is separated into nine light paths (10% energy loss occurs at this time) by a separation element (not shown) and is concentrated in the micro region 113c of the phosphor layer 113 through a corresponding one of the microlenses 111B. The light of 0.5 W concentrated in the micro region 113c is converted into light of the second wavelength at a conversion efficiency of 80% (i.e., 20% loss), and 25% Stokes loss occurs at the wavelength conversion. In this case, Joule heat of 0.2 W is generated in the micro region 113c. If the thermal conductive layer 114 is made of glass, the temperature of the micro region where the excitation light is concentrated is over 300° C. at a maximum in a central portion of the optical element. In general, the conversion efficiency of a phosphor is significantly reduced when the temperature of the phosphor exceeds 200° C. Accordingly, in this case, the functions of the optical element are significantly deteriorated. On the other hand, if the thermal conductive layer 114 is made of ZnO, the temperature of the micro region where the excitation light is concentrated is about 150° C. Accordingly, the functional deterioration of the optical element is significantly reduced. Thus, by using ZnO as the material of the thermal conductive layer 114, it is possible to improve heat dissipation capability and reduce a local temperature increase. As a result, the light conversion efficiency of the phosphor can be improved.

TABLE 1

| Material | Thermal Conductivity | Refractive Index |
| --- | --- | --- |
| Glass | 0.3 W/mK | 1.5 |
| Plastic (Resin) | 0.3 W/mK | 1.5 |
| Sapphire | 45 W/mK | 1.7 |
| ZnO film | 5 W/mK | 2.0 |
| AlN film | 230 W/mK | 2.1 |
| Diamond | 1500 W/mK | 2.2 |
| Graphene | 1500 W/mK | — |

Table 1 shows thermal conductivities of various materials. The thermal conductivity of each of glass and a resin material is about 0.3 W/mK, while the thermal conductivity of ZnO is about 5 W/mK. Thus, it is more effective if the thermal conductive layer 114 is made of a material whose thermal conductivity is higher than the thermal conductivity of the phosphor layer 113 made of a resin material, and is more effective if in particular AlN or diamond, etc., with higher thermal conductivity is used. Alternatively, the thermal conductive layer 114 may be a multilayer film including a plurality of layers. With the thermal conductive layer 114 made of a multilayer film, it is easy to achieve a structure that does not easily reflect light of the first wavelength, but easily reflects light of the second wavelength. If the light of the second wavelength is easily reflected, light radiated from the phosphor layer 113 to the thermal conductive layer 114 can be effectively reflected to the second optical member 112, which increases utilization efficiency of the light. In the case where the thermal conductive layer 114 is made of a multilayer film, not all the layers need to be made of a same material. In this case, the average thermal conductivity of the thermal conductive layer 114 may be higher than the thermal conductivity of the phosphor layer 113. In this case, the above multilayer film can be easily obtained by using, for example, sapphire and an AlN film which have different refractive indexes and high thermal conductivities. If the phosphor layer 113 is made of a plurality of materials and does not have an uniform thermal conductivity, the thermal conductivity of the thermal conductive layer 114 may be set higher than the average thermal conductivity of the phosphor layer 113.

The optical element of the present embodiment can be used as a light source of an image display device 200 illustrated in FIG. 5. The image display device 200 has a plurality of light sources 210. The light sources 210 are placed on a side of a light guide plate 212 so that light emitted from the light sources 210 is incident on the light guide plate 212. The light guide plate 212 is provided on the back side of an image display section 214. FIG. 5 illustrates an example in which five light sources 210 are provided. However, the number of light sources 210 may be changed as appropriate, according to the size of the image display section 214.

Figure 6:
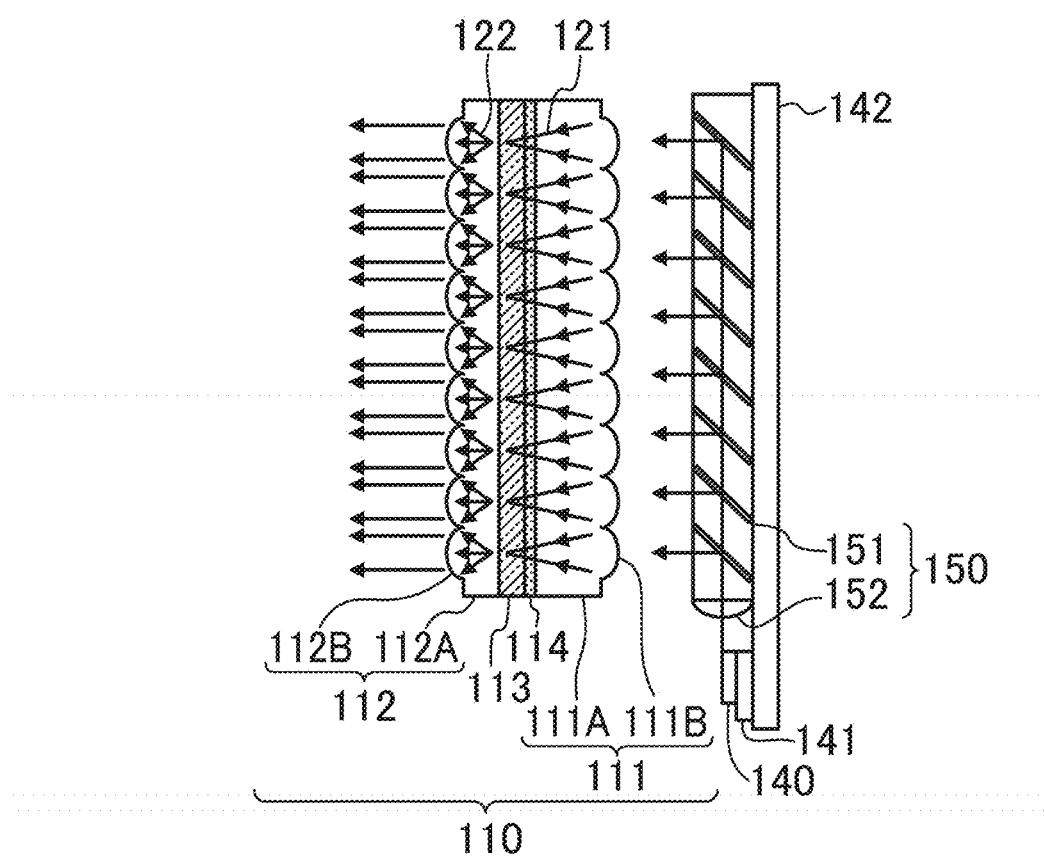
FIG. 6 is a cross-sectional view of a light emitting device in which an optical device of the first embodiment is used.

A semiconductor light emitting device to serve as the light source 210 has an optical element 110 of the present embodiment, a light emitting element 140 such as a semiconductor laser element, and a light guide element 150 which guides the light emitted from the light emitting element 140 to enter the optical element 110 as parallel light, as illustrated in FIG. 6, for example. Preferably, the light emitting element 140 generates light with high directivity, such as a semiconductor laser element. The light emitting element 140 is fixed to a base 142, with a submount 141 interposed therebetween, such that light is emitted in a direction parallel to a principal surface of the base 142.

The light guide element 150 is fixed to the base 142 such that the light emitted from the light emitting element 140 enters the light guide element 150. The light guide element 150 includes a light dividing section 151 and a collimator lens 152 provided between the light emitting element 140 and the light dividing section 151. The light emitted from the light emitting element 140 is converted into parallel light by the collimator lens 152, and thereafter enters the light dividing section 151. The light dividing section 151 includes a plurality of split mirrors layered one another to reflect part of the incident light and transmit the rest of the incident light. Thus, the light which has entered the light dividing section 151 is divided into a plurality of optical paths having optical axes parallel to each other.

The light which has been divided into the optical paths by the light dividing section 151 separately enters the plurality of microlenses 111B provided on the first optical member 111 of the optical element 110. The optical element 110 and the light guide element 150 are positioned such that the optical axis of each of the microlenses 111B and the optical axis of light divided by the light dividing section 151 are aligned. As described earlier, the wavelength of the light incident on the optical element 110 is converted, and the light is emitted as parallel light through the microlenses 112B of the second optical member 112.

Figure 7A:
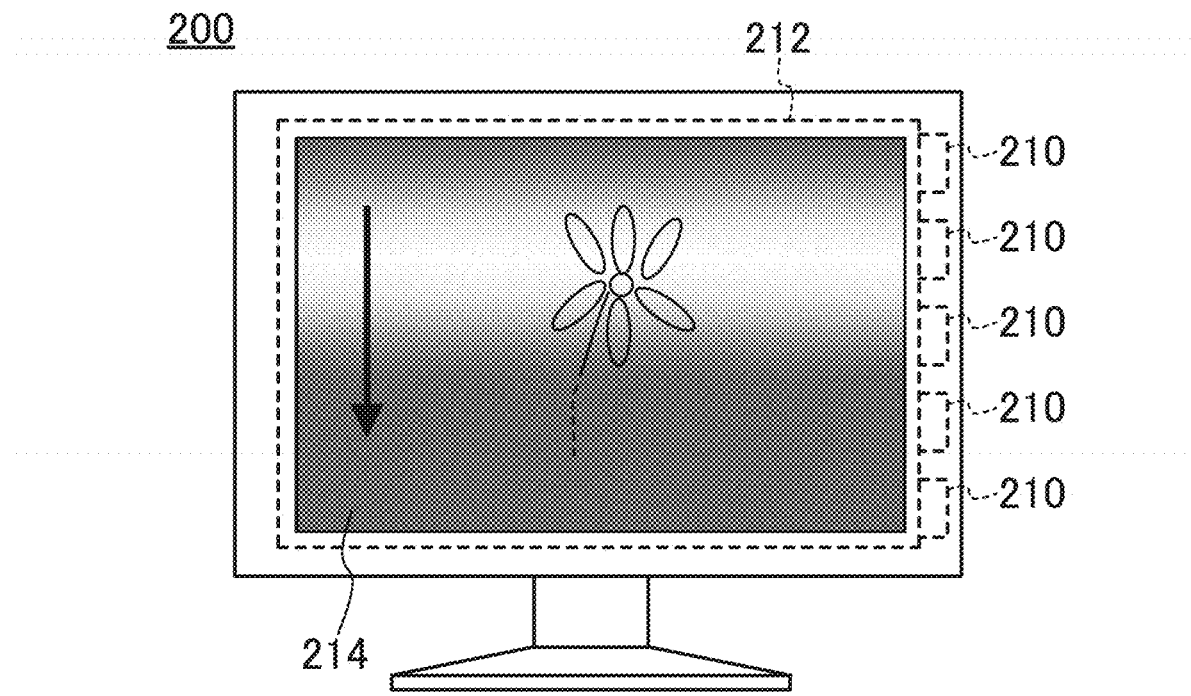
FIG. 7(A) and FIG. 7(B) show schematic views for illustrating example functions of the image display device.
Figure 7B:
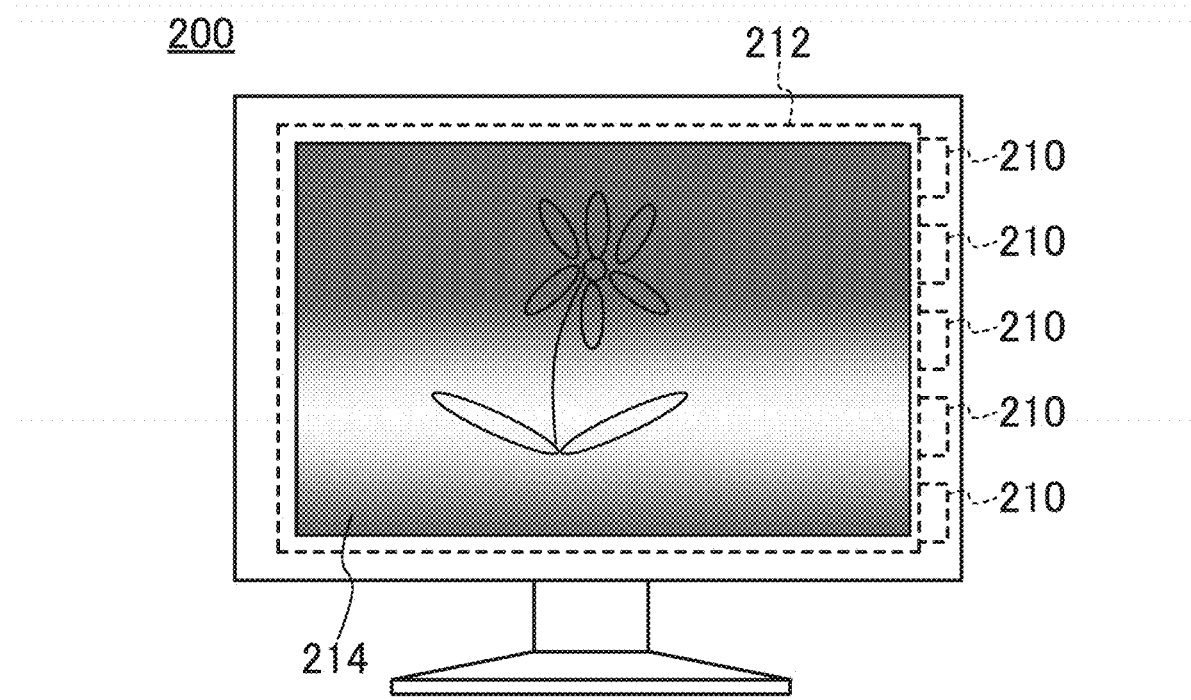

The image display device 200 has the following advantages because the light sources 210 emit parallel light. The light emitted from the light sources 210 enters the light guide plate 212, and is guided in the light guide plate 212, while being repeatedly reflected, and part of the light is led to the image display section 214. If the light emitted from the light sources 210 is parallel light, brightness of the image display section 214 can be changed along a scanning direction by adjusting an amount of light emitted from the light sources 210. For example, FIG. 7(a) shows the state in which only the second light source 210 from the top emits light, and FIG. 7(b) shows the state in which only the fourth light source 210 from the top emits light. Necessary part of the signals input to the image display section 214 can be displayed as an image by letting some of the light sources 210 emit light. As a result, the image display device can be controlled with more accuracy.

Figure 8A:
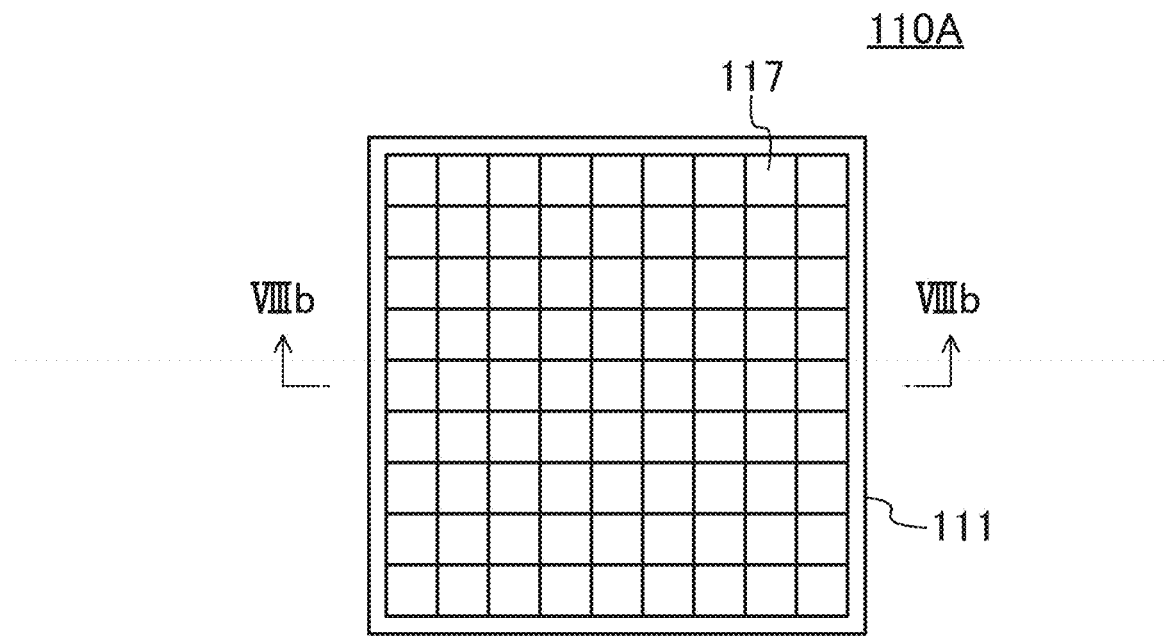
FIG. 8(A) and FIG. 8(B) show the first variation of the optical element of the first embodiment.
Figure 8B:
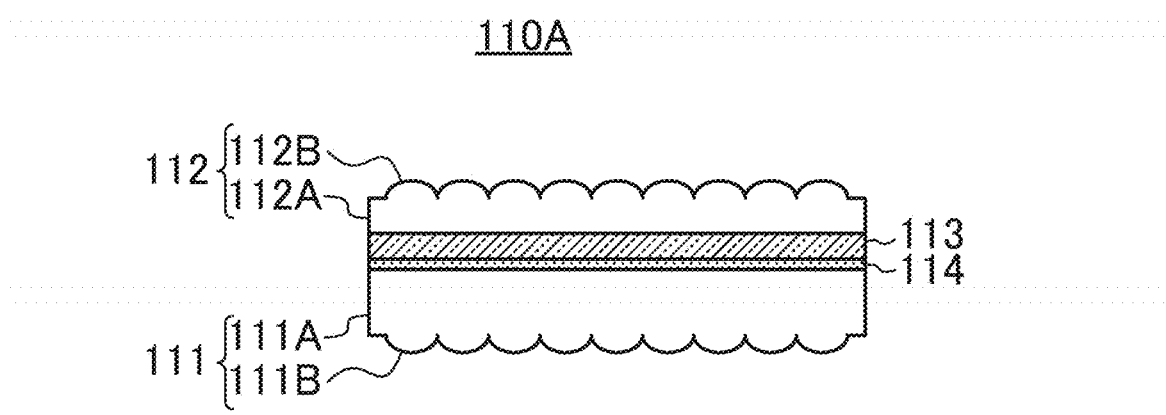
Figure 9:
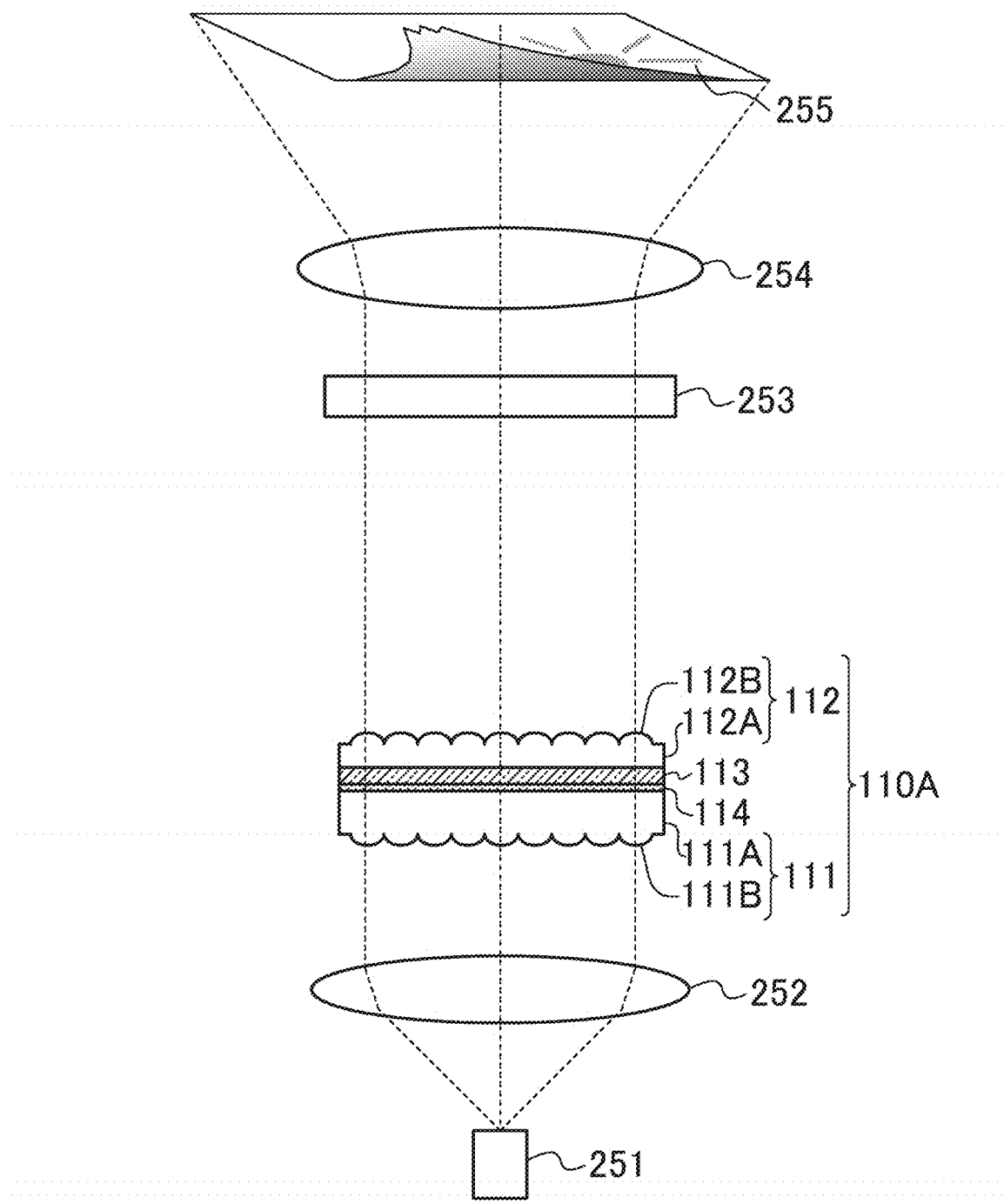
FIG. 9 is a schematic view illustrating an example image display device in which the optical element of the first variation is used.

FIG. 1 illustrates an example in which microlenses, which are condensing lenses and collimator lenses, are arranged in a single line. However, as illustrated in FIG. 8(a) and FIG. 8(b), the optical element 110A may be comprised of microlenses 111B and 112B arranged in a matrix. By using the optical element 110A comprised of microlenses arranged in a matrix, it is possible to obtain an image display device 250 illustrated in FIG. 9. Light emitted from the light emitting element 251 is converted into parallel light by a collimator lens 252, and thereafter enters the optical element 110A. The light which has entered the optical element 110A is concentrated in a plurality of light concentration regions by the microlenses 111B of the first optical member 111. The fluorescent light generated in each of the light concentration regions is emitted as parallel light from a corresponding one of the microlenses 112B. The parallel light emitted from the optical element 110A enters an optical modulator 253. The optical modulator 253 modulates the incident light to generate an image, and the image is projected as a projected image 255 by a projector lens 254.

In the case where the microlenses are arranged in a matrix, dissipating heat from a micro region of the phosphor layer 113 where light is concentrated is more important than in the case where the microlenses are arranged in a single line. FIG. 10 shows results of simulations of temperature distributions of the phosphor layer 113 in the cases where the thermal conductive layer 114 is made of glass ($\lambda$=0.3 W/mK), made of ZnO ($\lambda$=5 W/mK), made of an AlN film ($\lambda$=230 W/mK), and made of diamond ($\lambda$=1500 W/mK). The optical element used in the simulations has a 45 mm square light-entering region in which microlenses are arranged in a 9×9 matrix, and each of condensing lenses concentrates light in a 1 mm square area. If the incident light from the light source is 40 W, and is divided into 81 light paths and concentrated in micro regions, it means that light of approximately 0.5 W is concentrated in each of the micro regions. If heat generated at this time is 0.2 W, similar to the case as described above, and the temperature of the periphery of the optical element is fixed to 40° C. due to a heat dissipation plate (not shown) to thermally insulate the microlens surfaces, the temperature of the light concentration region in a central portion of the optical element significantly increases up to above 4000° C. in the case where the thermal conductive layer 114 is made of glass. However, in the case where the thermal conductive layer 114 is made of a AlN film or diamond, the temperature of the light concentration region is just slightly higher than the peripheral temperature, and the temperature is 150° C. or less.

Thus, also in the case where the microlenses are arranged in a matrix, it is possible to improve the heat dissipation capability and improve the light conversion efficiency of the phosphor by providing the thermal conductive layer 114 with high thermal conductivity. FIG. 8 illustrates an example in which the microlenses are arranged in a 9×9 matrix, but the microlenses may be arranged in a matrix of any size.

The optical element of the present embodiment may be formed by a method described below. First, as illustrated in FIG. 11(a), a mask pattern 161 made of e.g., a resist is formed on a first surface of the first transparent substrate 111A to be a first optical member 111. The transparent substrate may be made of glass, such as BK7. Next, as illustrated in FIG. 11(b), the first surface of the first transparent substrate 111A is selectively etched using an etchant, such as hydrofluoric acid. As a result, the first optical member 111 with microlenses 111B, which are condensing lenses, is obtained. Subsequently, as illustrated in FIG. 11(c), a thermal conductive layer 114 made of ZnO or diamond is formed on a second surface of the first optical member 111. The thermal conductive layer 114 may be formed by a sputtering method or a chemical vapor deposition (CVD) method, etc. Next, as illustrated in FIG. 11(d), a phosphor-contained, ultraviolet-curing resin 113A to be a phosphor layer 113 is applied on the thermal conductive layer 114. The phosphor may be appropriately selected according to the wavelengths of incident light and emitted light, but may be YAG:Ce3+, etc. The ultraviolet-curing resin may be a silicone resin or an epoxy resin, etc. The resin forming the phosphor layer is not limited to the ultraviolet-curing resin, but may be a heat-curing resin, etc. Alternatively, the phosphor layer may be made of phosphor particles and an inorganic transparent material, such as low-melting glass.

Figure 12A:
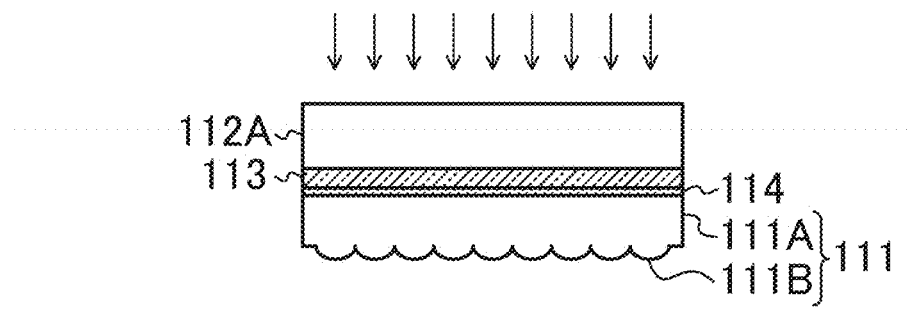
FIGS. 12A-12C show cross-sectional views for illustrating a method for fabricating the optical element of the first embodiment in the order of steps.
Figure 12B:
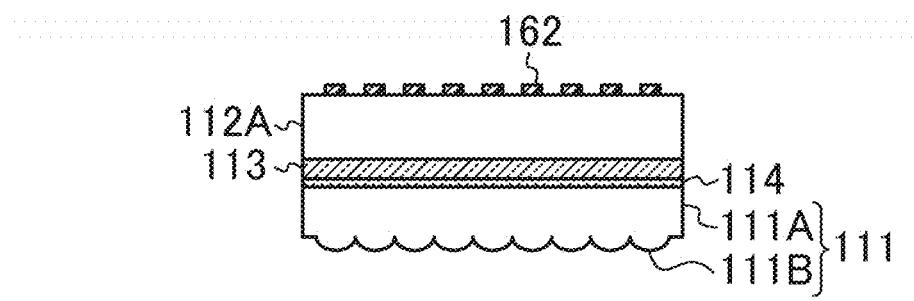

Next, as illustrated in FIG. 12(a), a second transparent substrate 112A to be a second optical member 112 is adhered onto the resin 113A, and is thereafter cured by irradiating the resin 113A with ultraviolet rays, thereby forming the phosphor layer 113 and adhering the second transparent substrate 112A. Subsequently, as illustrated in FIG. 12(b), a mask pattern 162 made of e.g., a resist is formed on the second transparent substrate 112A. The mask pattern 162 is positioned so as to coincide with the microlenses 111B. After that, the second transparent substrate 112A is selectively etched using an etchant, such as hydrofluoric acid. As a result, the second optical member 112 with microlens 112B, which are collimator lenses, is obtained.

The optical element in which the microlenses 111B and 112B are arranged in a single line can be formed in a similar manner.

The thermal conductive layer 114, the phosphor layer 113, and the second optical member 112 can be easily formed on the first optical member 111 by setting the thickness of the first transparent substrate 111A to be relatively thick about 10 mm. Further, the microlens 112B can be a collimator lens with a relatively large curvature by setting the thickness of the second transparent substrate 112A to be relatively thin about 3 mm. As a result, light radiated from the micro regions of the phosphor layer 113 in all directions can be efficiently converted into parallel light.

A method in which the microlenses are formed by etching has been described, but the microlenses may be made of a transparent material that is soft at a low temperature, using a mold.

Figure 13:
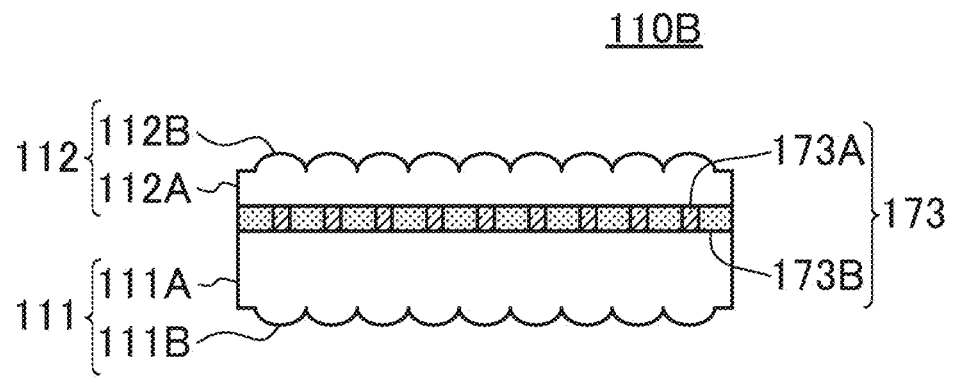
FIG. 13 shows cross-sectional views of the second variation of the optical element of the first embodiment.

FIG. 1, etc., illustrates an example in which a thermal conductive layer is provided in addition to a phosphor layer. However, phosphor may be present only in a region where light is concentrated. Thus, the optical element may have a configuration of an optical element 110B as illustrated in FIG. 13. The optical element 110B has a phosphor layer 173 which includes a first region 173A containing a phosphor, and a second region 173B that surrounds the first region 173A and has a thermal conductivity higher than a thermal conductivity of the first region 173A. The first region 173A may be a resin layer containing a phosphor, such as YAG:Ce3+. The second region 173B may be made of ZnO or diamond with a higher thermal conductivity than the thermal conductivity of the first region 173A.

Figure 12C:
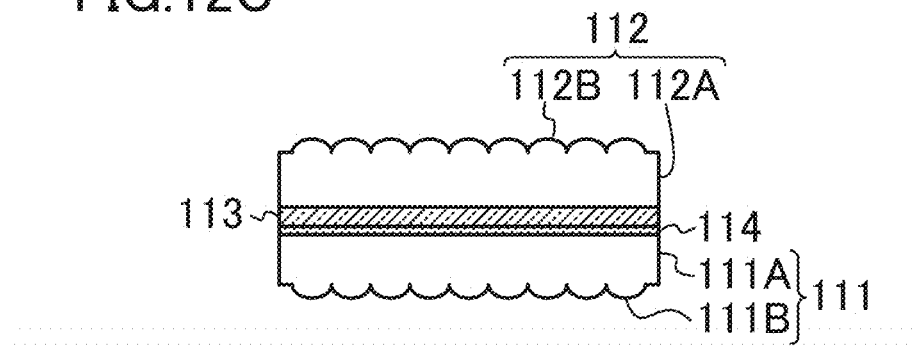
Figure 14A:
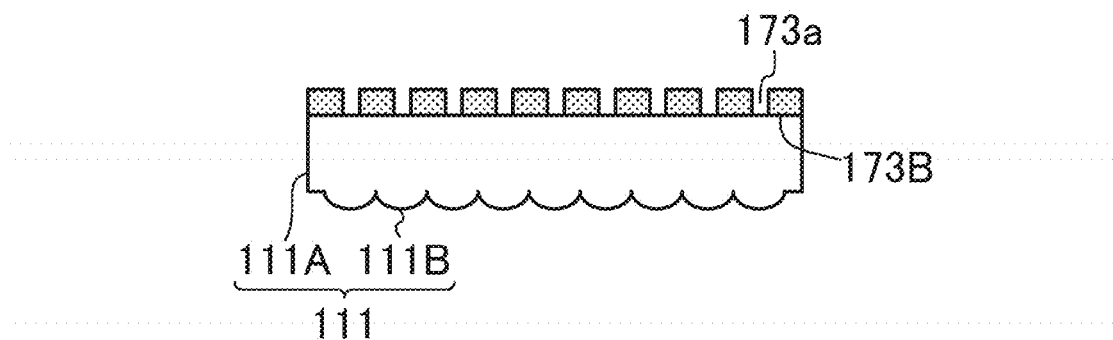
FIGS. 14A-14B show cross-sectional views for illustrating a method for fabricating the optical element of the second variation in the order of steps.
Figure 14B:
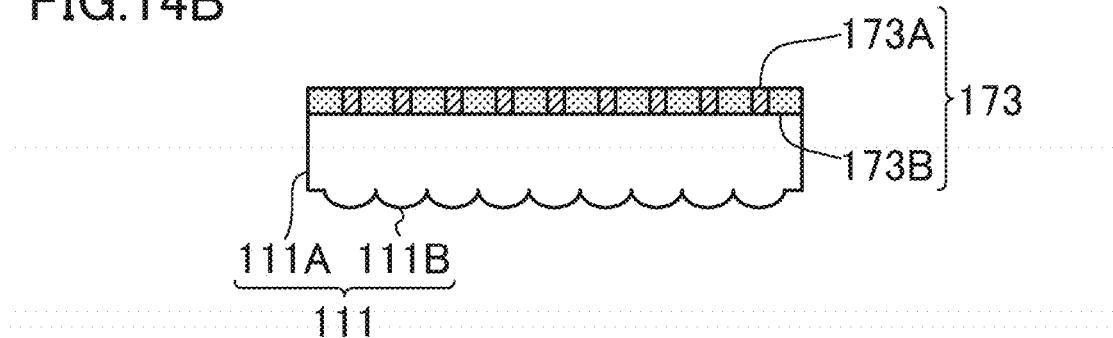

The optical element 110B is formed in a manner described below. First, steps similar to the steps illustrated in FIG. 11(a) and FIG. 11(b) are performed to obtain a first optical member 111 with the microlenses 111B. Next, as illustrated in FIG. 14(a), a ZnO layer, etc., to be the second region 173B is formed on a second surface of the first optical member 111 by a sputtering method or a CVD method. Subsequently, the ZnO layer, etc., is patterned to form a plurality of openings 173a through which the first optical member 111 is exposed. Next, as illustrated in FIG. 14(b), an ultraviolet-curing resin containing a phosphor and to be the first region 173A is applied to fill in the openings 173a. The phosphor may be appropriately selected according to the wavelengths of incident light and emitted light, but may be YAG:Ce3+, etc. The ultraviolet-curing resin may be a silicone resin or an epoxy resin, etc. After that, steps similar to the steps illustrated in FIG. 12(a) to FIG. 12(c) are performed to cure the ultraviolet-curing resin and form the second optical member 112.

The resin forming the phosphor layer is not limited to the ultraviolet-curing resin, but may be a heat-curing resin, etc. Alternatively, the phosphor layer may be made of phosphor particles and an inorganic transparent material, such as low-melting glass. For example, patterning becomes easy by using an inorganic transparent material, such as spin-on glass.

Figure 15:
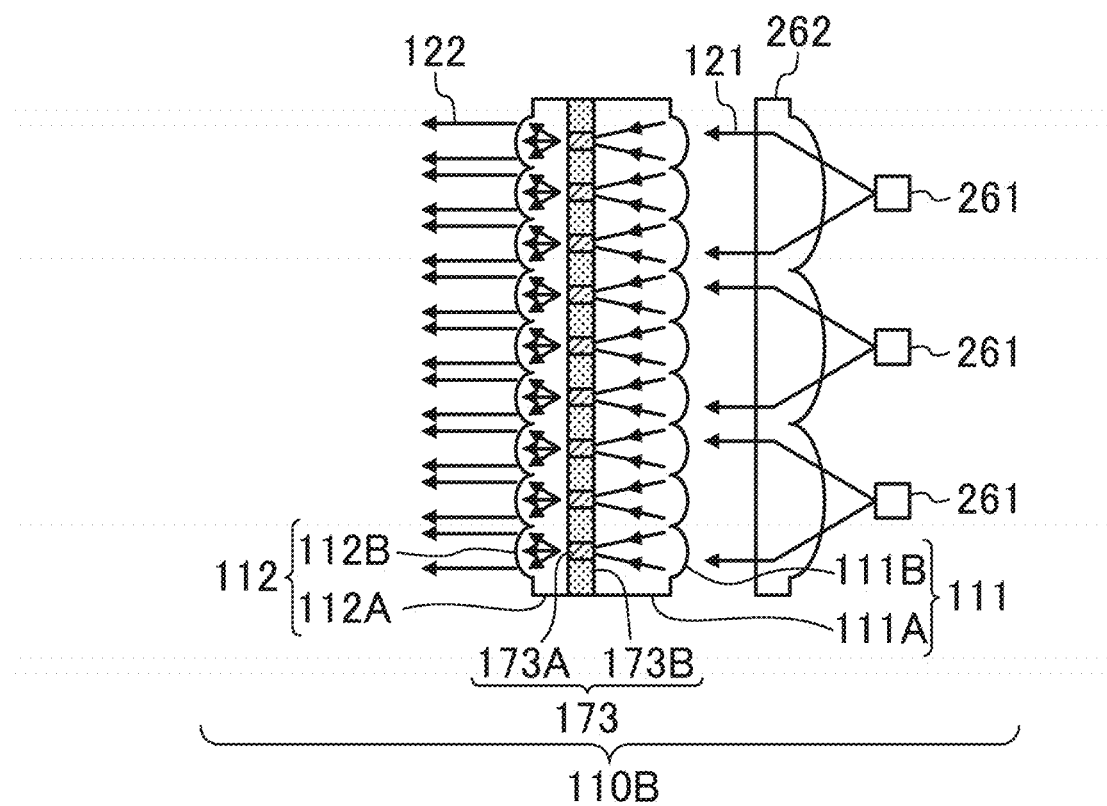
FIG. 15 is a cross-sectional view of a light emitting device in which the optical element of the second variation is used.

The optical element 110B may be configured such that the microlenses are arranged in a single line like the optical element 110, or may be configured such that the microlenses are arranged in a matrix like the optical element 110A. The optical element 110B can be used in a similar manner as the optical element 110 and the optical element 110A, but the optical element 110B may be used in combination with a plurality of light emitting elements 261, as illustrated in FIG. 15. The light emitted from each of the light emitting elements 261 is converted into parallel light by a corresponding collimator lens 262, and thereafter enters the optical element 110B. The optical element 110 and the optical element 110A may also have this configuration.

Figure 16:
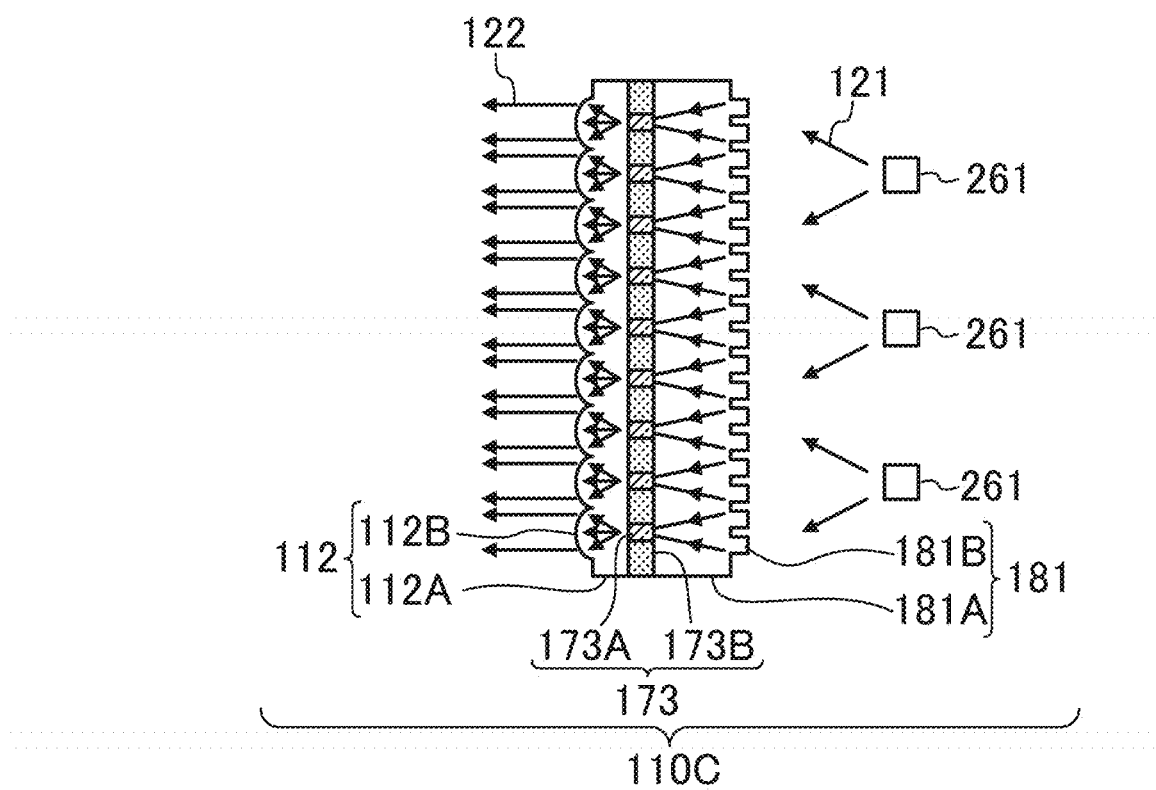
FIG. 16 is a cross-sectional view of the third variation of the optical element of the first embodiment.

As illustrated in FIG. 16, an optical element 110C may have configuration in which a first optical member 181 includes a first transparent substrate 181A and a diffraction grating 181B, for concentrating light in the first region 173A of the phosphor layer 173. In this configuration, it is not necessary to provide the collimator lens 262, and therefore, the number of parts can be reduced. In place of the phosphor layer 173 integrally formed with a thermal conductive layer, a phosphor layer and a thermal conductive layer may be separately provided.

Figure 17:
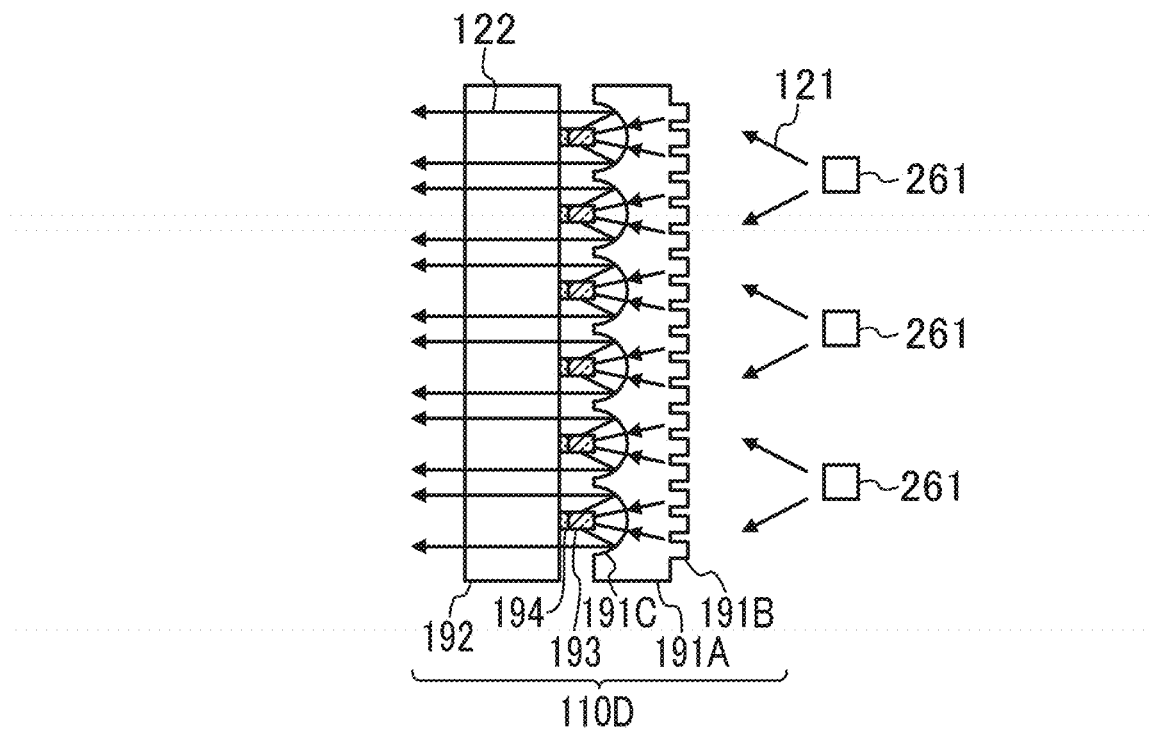
FIG. 17 is a cross-sectional view of the fourth variation of the optical element of the first embodiment.

As illustrated in FIG. 17, an optical element 110D may have a configuration in which fluorescence is converted into parallel light by a reflecting mirror 191C in place of the microlenses 112B. The optical element 110D includes a first transparent substrate 191A having a diffraction grating 191B on a first surface thereof and a reflecting mirror 191C on a second surface thereof, a second transparent substrate 192, and a phosphor layer 193 provided on the second transparent substrate 192, with a thermal conductive layer 194 interposed therebetween. The reflecting mirror 191C may be a parabolic mirror having a paraboloid obtained by rotating a parabola about the symmetry axis. Light radiated from each of the light emitting elements 261 is transmitted through the reflecting mirror 191C due to the diffraction grating 191B and is concentrated in the phosphor layer 193. The light concentrated in the phosphor layer 193 has a predetermined wavelength, and enters the reflecting mirror 191C. The light having entered the reflecting mirror 191 is reflected and collimated, and is transmitted through the second transparent substrate 192 and emitted. The light having entered the phosphor layer 193 is diffusely reflected (i.e., Lambertian reflectance). It is therefore possible to use the Lambertian reflected light, and further increase utilization efficiency of light.

Second Embodiment

Figure 18:
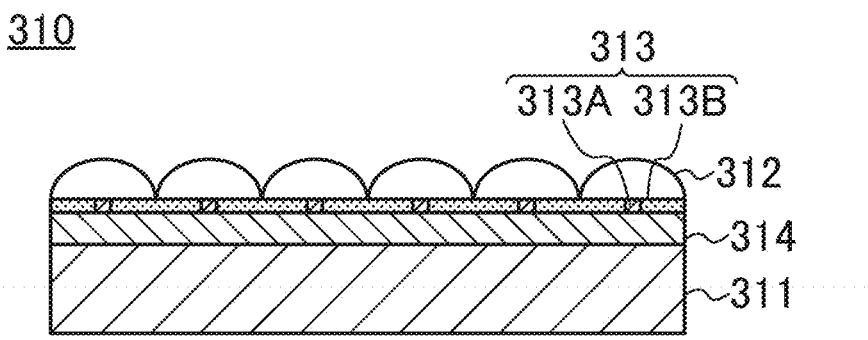
FIG. 18 is a cross-sectional view of an optical element of the second embodiment.

As illustrated in FIG. 18, an optical element 310 of the second embodiment has a first substrate 311, a phosphor layer 313 formed on the first substrate 311, with a reflective layer 314 interposed therebetween, and a microlens 312 formed on the phosphor layer 313.

The first substrate 311 may be a silicon substrate, etc. The reflective layer 314 may be made of a metal material having a high reflection coefficient for visible light, such as silver or aluminum. The phosphor layer 313 has a first region 313A made of a phosphor-contained material in which phosphor particles and a binder material are mixed, and a second region 313B which surrounds the first region 313A. The phosphor may be a rare earth phosphor such as YAG:Ce3+, or a quantum dot phosphor, etc. The binder material may be resin, or a transparent inorganic material, etc. In the case of resin, the binder material may be a transparent resin, such as silicone or epoxy resin. In the case of a transparent inorganic material, the binder material may be a glass material, such as low-melting glass. The second region 313B may be made of a material whose thermal conductivity is higher than the thermal conductivity of the first region 313A, such as graphene, diamond, ZnO, etc. The microlens 312 is made of glass, etc., and is configured to be in focus on the first region 313A of the phosphor layer 313.

Figure 19:
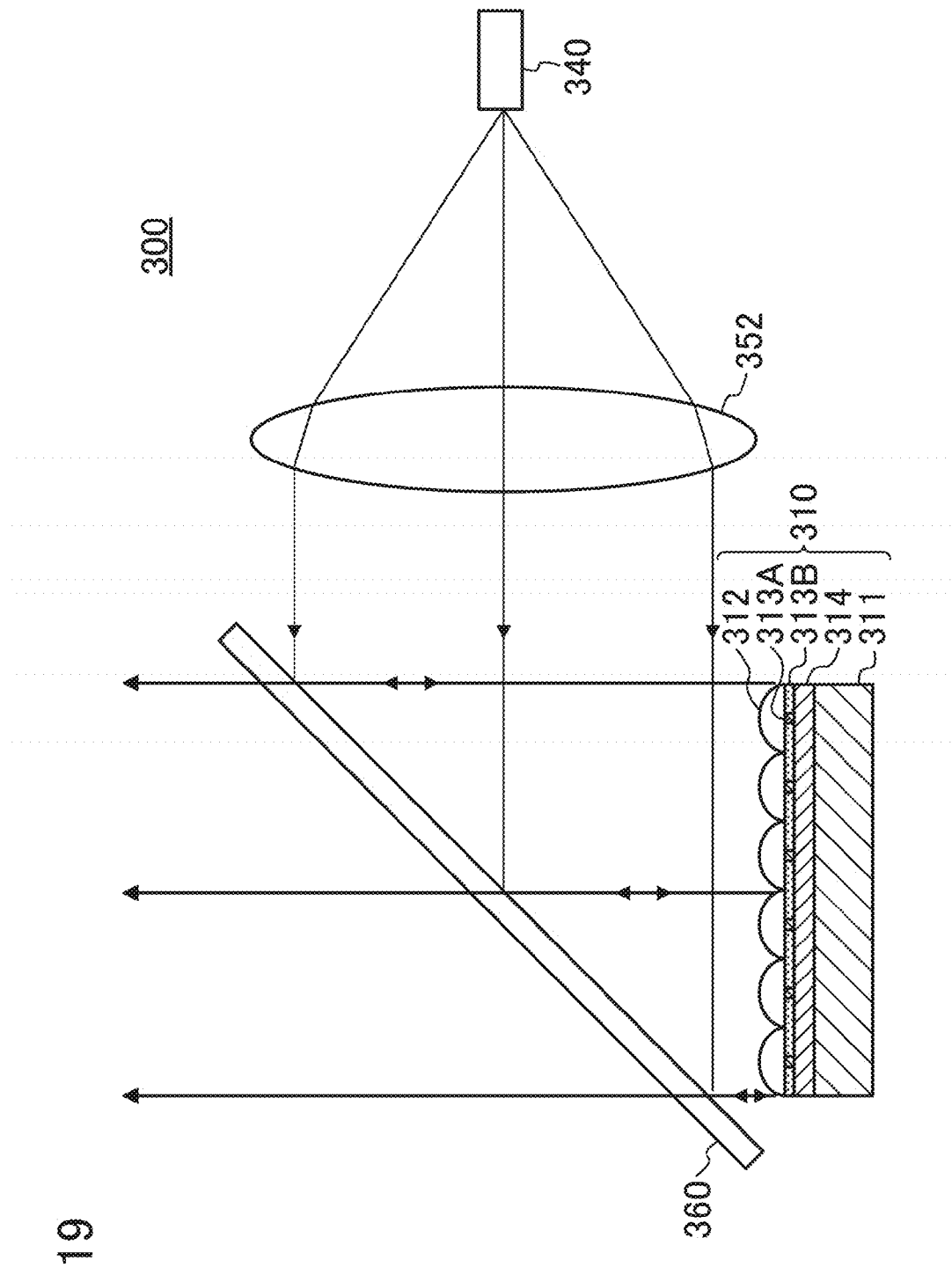
FIG. 19 is a schematic view of a light emitting device in which the optical element of the second embodiment is used.
Figure 20A:
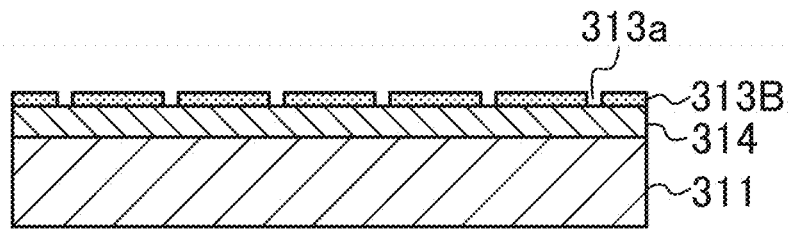
FIGS. 20A-20D show cross-sectional views for illustrating a method for fabricating the optical element of the second embodiment in the order of steps.
Figure 20B:
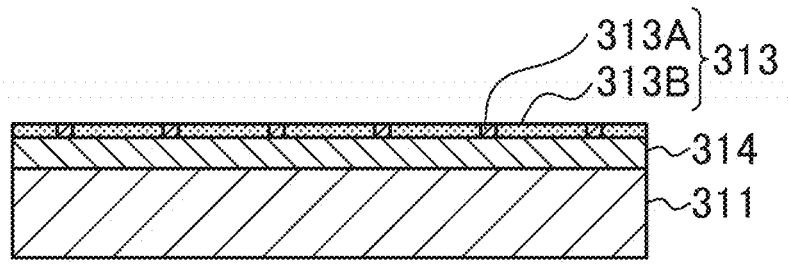
Figure 20C:
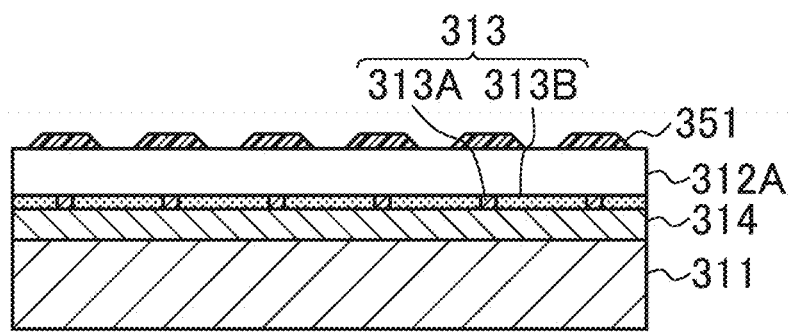
Figure 20D:
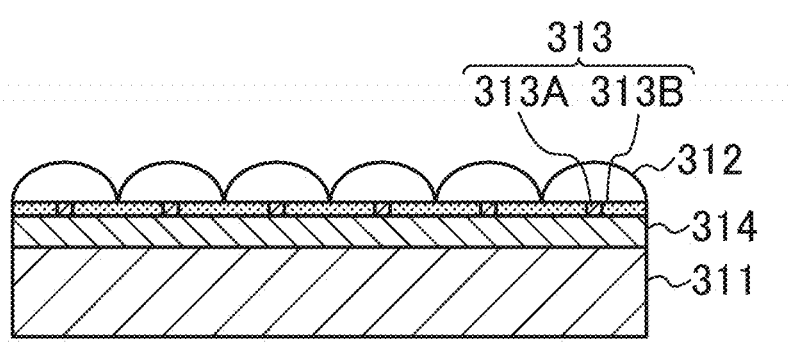

FIG. 19 illustrates a configuration and a working mechanism of a light emitting device 300 using the optical element 310 of the present embodiment. The light emitting device 300 has a light emitting element 340, a collimator lens 352 which converts light emitted from the light emitting element 340 into parallel light, and a dichroic mirror 360 which reflects the parallel light and make it enter the optical element 310.

The light reflected by the dichroic mirror 360 and having entered the optical element 310 is concentrated in a first region 313A of the phosphor layer 313 by the microlens 312 of the optical element 310. The light concentrated in the first region 313A is converted into light with a predetermined wavelength by the phosphor, and is diffusely reflected (i.e., Lambertian reflectance). The reflected light is converted into parallel light by the microlens 312, and is emitted from the optical element 310. The light emitted from the optical element 310 is transmitted through the dichroic mirror 360 and is emitted from the light emitting device 300 as parallel light.

Heat generated when the light wavelength is converted in the phosphor layer 313 is efficiently transmitted to a periphery of the optical element 310, and is dissipated, due to a second region 310B of the phosphor layer 313 and the reflective layer 314.

The optical element 310 of the present embodiment may be formed by a method described blow. First, as illustrated in FIG. 20(*a*), a reflective layer 314 made of silver or aluminum, etc., is formed on a first substrate 311, which is a silicon substrate, etc., by an evaporation method, a sputtering method, or a CVD method, etc. Subsequently, a layer which is to be a second region 313B of the phosphor layer 313 and is made of graphene, diamond, or ZnO, etc., is formed, and thereafter, a plurality of openings 313*a* are formed by a semiconductor process technique, such as photolithography, etching, and lift-off methods. Next, as illustrated in FIG. 20(*b*), a phosphor-contained resin to be a first region 313A is applied so as to fill the openings 313*a*, by spin coating, etc. Next, as illustrated in FIG. 20(*c*), a second substrate 312A that is a transparent substrate is adhered to the phosphor layer 313, and thereafter, a resist mask 351 is formed on the second substrate 312A. The resist mask 351 is formed so as to coincide with the first region 313A. Next, as illustrated in FIG. 20(*d*), the second substrate 312A is selectively etched by wet etching using hydrofluoric acid, etc., to form the microlens 312.

FIG. 20 shows an example in which the microlenses 312 are separate from one another. However, the microlenses 312 may be integrally formed on one surface of the second substrate 312A, depending on the thickness of the second substrate 312A and a required curvature of the microlenses 312, etc. In this case, it is preferable that the thickness of the connecting portion of the microlenses 312 is as thin as possible.

A method of forming the microlens 312 by wet etching has been described. Alternatively, the second substrate 312A in which the microlens 312 is formed beforehand using a mold, etc., may be adhered to the phosphor layer 313 after positioning between the microlens 312 and the first region 313A.

In the first and second embodiments, an example in which the light emitting element is a semiconductor laser element has been mainly described, but the light emitting element may be anything which emits light with superior directivity. For example, super luminescent diode may be used.

In the first and second embodiments, the wavelength of the light of the first wavelength is 430 nm to 480 nm, but the light may have any wavelength which can excite a phosphor. For example, the light may be ultraviolet light having a wavelength of 350 nm to 390 nm, and near ultraviolet light having a wavelength of 390 nm to 430 nm.

In the first and second embodiments, the phosphor has been described mainly as YAG:Ce3+, but is not limited to YAG:Ce3+. For example, europium-activated β—SiAlON crystal or silicate crystal may be used in the case of wanting to use green fluorescence having a wavelength of about 530 nm as the light of the second wavelength. Alternatively, Cerium-activated $Ca_3Sc_2Si_3O_{12}$ or Cerium-activated $CaSc_2O_4$ may provide green light of the second wavelength of about 520 nm with high conversion efficiency. Further, europium-activated (Sr, Ca)$AlSiN_3$ or $CaAlSiN_3$ may be used in the case of wanting to use red fluorescence having a wavelength of about 640 nm as the light of the second wavelength.

In the first and second embodiments, only an example in which the phosphor layer is made of one type of phosphor has been described, but the phosphor layer is not limited to this configuration. For example, the phosphor layer may have various phosphors in a plane, thereby making it possible to emit light of a plurality of wavelengths as the light of the second wavelength. For example, a semiconductor light emitting device which emits white light can be obtained by combining the light of the first wavelength of 430 nm to 480 nm with phosphors producing green light and red light. Further, an optical element may be configured by combining phosphors producing green light and red light, and a phosphor producing blue light such as (Ba,Sr)$MgAl_{10}O_{17}$:Eu or (Sr,Ca,Ba,Mg)$_{10}$(PO$_4$)$_6$C$_{12}$:Eu. This configuration makes it possible to obtain a semiconductor light emitting device which emits white light due to excitation light such as ultraviolet light or near ultraviolet light.

The optical element of the present disclosure is useful as an optical element, etc., used for a light source having less energy loss and capable of emitting light with directivity even if the wavelength is converted.

What is claimed is:

1. An optical element, comprising:
   a phosphor layer containing a phosphor which is excited by light of a first wavelength and radiates light of a second wavelength different from the first wavelength;
   a first optical member provided on a first surface of the phosphor layer and configured to concentrate light in the phosphor layer; and
   a second optical member provided on a second surface of the phosphor layer, which is opposite to the first surface, and configured to convert light radiated from the phosphor layer into parallel light, wherein:
   the phosphor layer includes:
      a plurality of first regions each containing the phosphor; and
      a second region which surrounds the plurality of first regions and has a thermal conductivity higher than a thermal conductivity of the first regions, and
   the first optical member concentrates light in each of the plurality of first regions.

2. The optical element of claim 1, wherein
   the first optical member is a first transparent substrate having a condensing lens.

3. The optical element of claim 1, wherein
   the first optical member is a first transparent substrate having a diffraction grating.

4. The optical element of claim 1, wherein
   the second optical member is a second transparent substrate provided on the second surface and having a collimator lens.

5. The optical element of claim 1, wherein
   the second region is made of zinc oxide, aluminum nitride, or diamond.

6. A semiconductor light emitting device, comprising:
   the optical element of claim 1;
   a light emitting element which emits the light of the first wavelength; and
   a light dividing section which divides light emitted from the light emitting element into a plurality of optical paths having optical axes parallel to each other to have the optical paths enter the optical element.

7. The optical element of claim 1, further comprising:
   a thermal conductive layer provided between the phosphor layer and the first optical member or the second optical member, and having a thermal conductivity higher than a thermal conductivity of the phosphor layer.

8. The optical element of claim 7, wherein
   the thermal conductive layer is made of zinc oxide, aluminum nitride, or diamond.

9. The optical element of claim 7, wherein
   the thermal conductive layer is a multilayer film.

10. An optical element, comprising:
    a phosphor layer containing a phosphor which is excited by light of a first wavelength and radiates light of a second wavelength different from the first wavelength;
    a optical member provided on a first surface of the phosphor layer, including a plurality of lens, and configured to concentrate light in the phosphor layer and convert light radiated from the phosphor layer into parallel light; and
    a reflective layer provided on a second surface of the phosphor layer, wherein:
    the phosphor layer includes:
       a plurality of first regions each containing the phosphor; and
       a second region which surrounds the plurality of first regions and has a thermal conductivity higher than a thermal conductivity of the first regions,
    the plurality of lens concentrates light in each of the plurality of first regions, convert light radiated from the plurality of first regions into parallel light, and
    the reflective layer configured to reflect a part of light radiated from the plurality of first regions to a side of plurality of lens.

11. A semiconductor light emitting device, comprising:
    the optical element of claim 10;
    a light emitting element which emits the light of the first wavelength; and
    a light dividing section which divides light emitted from the light emitting element into a plurality of optical paths having optical axes parallel to each other to have the optical paths enter the optical element.

12. The optical element of claim 10, wherein
    the second region is made of zinc oxide, aluminum nitride, or diamond.

13. A optical element, comprising:
    an optical member including a first transparent substrate, and a diffraction grating and a reflecting mirror which are respectively provided on surfaces of the transparent substrate opposite to each other; and
    a phosphor substrate including a phosphor layer, thermal conductive layers having a thermal conductivity higher than a thermal conductivity of the phosphor layer, and a second transparent substrate, where the phosphor layer is provided on a principal surface of the second transparent substrate via the thermal conductive layers, and contains a phosphor which is excited by light of a first wavelength and radiates light of a second wavelength different from the first wavelength, Wherein:
    the optical member is provided spaced apart from the phosphor substrate so that the reflecting mirror is facing to the principal surface of the second transparent substrate,
    the diffraction grating concentrates light of the first wavelength in the phosphor layer, and
    the reflecting mirror configured to concentrates light in the phosphor layer and to reflect light of the second wavelength radiated from the phosphor layer.

14. A semiconductor light emitting device, comprising:
    the optical element of claim 13;
    a light emitting element which emits the light of the first wavelength; and
    a light dividing section which divides light emitted from the light emitting element into a plurality of optical paths having optical axes parallel to each other to have the optical paths enter the optical element.

* * * * *